United States Patent [19]

Gill et al.

[11] Patent Number: 5,045,491

[45] Date of Patent: Sep. 3, 1991

[54] METHOD OF MAKING A NONVOLATILE MEMORY ARRAY HAVING CELLS WITH SEPARATE PROGRAM AND ERASE REGIONS

[75] Inventors: Manzur Gill, Arcola; Theodore D. Lindgren, Houston, both of Tex.

[73] Assignee: Texas Instruments Incorporated, Dallas, Tex.

[21] Appl. No.: 589,342

[22] Filed: Sep. 28, 1990

[51] Int. Cl.$^5$ .......................................... H01L 21/70
[52] U.S. Cl. ...................................... 437/52; 437/43; 437/48; 437/49; 437/50; 437/193
[58] Field of Search ...................... 437/43, 48, 49, 50, 437/52, 191, 193, 195, 233, 235; 357/23.5; 364/185

[56] References Cited

U.S. PATENT DOCUMENTS

| | | |
|---|---|---|
| 4,822,750 | 4/1989 | Perlegos et al. ................. 437/43 |
| 4,833,096 | 5/1989 | Huang et al. .................... 437/43 |
| 4,853,895 | 8/1989 | Mitchell et al. ................. 437/43 |
| 4,924,437 | 5/1990 | Paterson et al. ................. 437/43 |
| 4,980,309 | 12/1990 | Mitchell et al. ................. 437/43 |
| 4,994,403 | 2/1991 | Gill .............................. 437/43 |

Primary Examiner—Brian E. Hearn
Assistant Examiner—Tom Thomas
Attorney, Agent, or Firm—Theodore D. Lindgren; Lawrence J. Bassuk; Melvin Sharp

[57] ABSTRACT

A nonvolatile memory cell having separate regions for programming and erasing. The cells are formed in an array at a face of a semiconductor body, each cell including a source that is part of a source-column line and including a drain that is part of a drain-column line. Each cell has first and second sub-channels between source and drain. The conductivity of the first sub-channel of each cell is controlled by a field-plate, which is part of a field-plate-column line, positioned over and insulated from the first sub-channel. The conductivity of each of the second sub-channels is controlled by a floating gate formed over and insulated from the second sub-channel. Each floating gate has a first tunnelling window positioned over the adjacent source-column line and has a second tunnelling window positioned over the adjacent drain-column line. Row lines, including control gates, are positioned above and insulated from the floating gates of the cells for reading, programming and erasing the cells. The field-plate conductor permits programming of the cells through the first tunnelling window only and erasing of the cells through the second tunnelling window only, or vice versa.

6 Claims, 5 Drawing Sheets

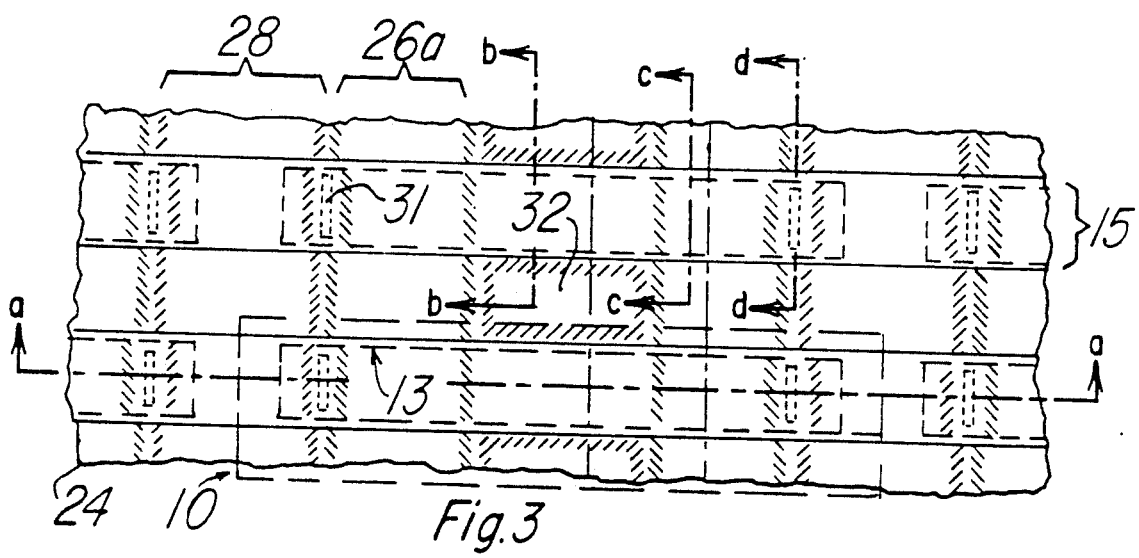
Fig. 3
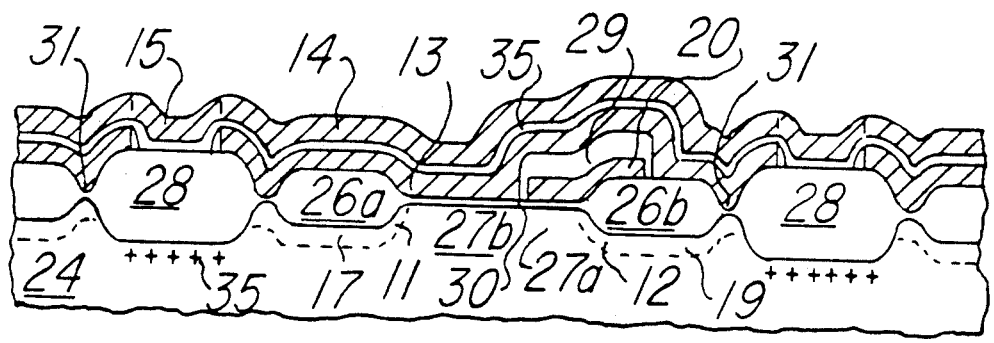
Fig. 4a
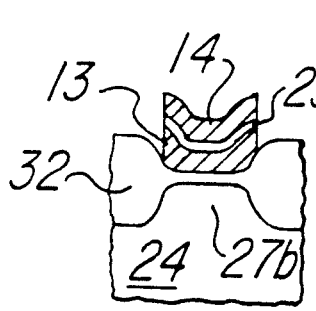 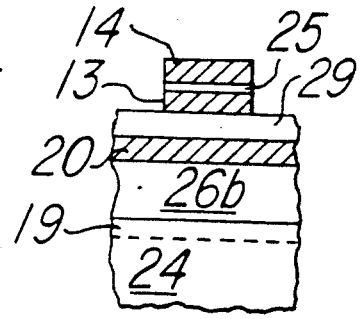 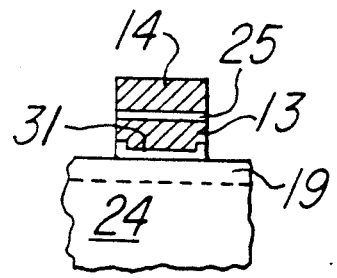
Fig. 4b   Fig. 4c   Fig. 4d

METHOD OF MAKING A NONVOLATILE MEMORY ARRAY HAVING CELLS WITH SEPARATE PROGRAM AND ERASE REGIONS

RELATED PATENT APPLICATIONS

This application is related to co-pending U.S. patent application Ser. No. 07/568,646, filed Aug. 13, 1990, which is a continuation of abandoned U.S. patent application Ser. No. 07/369,558 filed June 2, 1989. In addition, this application is related to co-pending U.S. patent application Ser. No. 07/444,585, filed Dec. 4, 1989 and to co-pending U.S. patent application Ser. No. 07/589,347, filed 9-28-90. The related applications are also assigned to Texas Instruments Incorporated.

BACKGROUND OF THE INVENTION

This invention relates to nonvolatile semiconductor memory devices, more particularly, to electrically-erasable, electrically-programmable, read-only memories (EEPROMs) of the floating-gate type and to methods for making and programming such devices.

The EEPROMs disclosed in co-pending U.S. patent applications Ser. No. 07/494,042; Ser. No. 07/494,051 and Ser. No. 07/494,060 provide greatly improved structures and methods for making nonvolatile memory cells having reduced size. The memory chips using those cells require one relatively low-voltage (perhaps +5 volts) external power supply. The memory cells of those inventions use Fowler-Nordheim tunnelling for erasure and for programming.

The nonvolatile memory cell structures disclosed in U.S. patent application Ser. No. 07/568,646, assigned to Texas Instruments Incorporated, include a cell structure without a split gate and having two Fowler-Nordheim tunnelling windows, one on the source side of each cell and the other on the drain side of each cell. The memory cell structures disclosed in U.S. patent application Ser. No. 07/444,585, also assigned to Texas Instruments Incorporated, include a paired cell structure without a split gate, but having one Fowler-Nordheim tunnelling window and having a field-plate to provide isolation between paired cells during programming. The memory cells of the latter application share a common drain-column line, reducing the number of bitlines required per column of cells from two to only one and one-half and, therefore, reducing the metal pitch in the array. The channels of the cell structures described in the latter application are divided into two sub-channels and the conductivities of each of the two series-connected sub-channels are individually controlled by the field-plate and the floating gate, respectively.

In general, the tunnelling window insulators of EEPROM memory cells deteriorate after a number, perhaps tens of thousands, of program/erase cycles, the deterioration causing inability of the floating gates to be charged or erased adequately. Use of a two-tunnelling-window structure such as that of the aforementioned U.S. patent application Ser. No. 07/568,646 would provide a cell with longer life if one of the tunnelling windows of each cell could be used for programming only and the other of the tunnelling windows could be used for erasing only. However, when connected in an array of rows and columns of such cells, the programming current does not generally flow solely through one of the tunnelling regions because the channel region is conductive during programming. There is a need for a two-tunnelling-window memory cell structure for use in an array in a manner that programming current is confined to one of the two tunnelling regions and erasing current is confined to the other.

SUMMARY OF THE INVENTION

In accordance with one embodiment of the invention, a nonvolatile memory array, or an EEPROM array, is constructed in a manner that each cell has two Fowler-Nordheim tunnelling windows and in which one of the two tunnelling windows of each cell is used for programming and in which the other of the two tunnelling windows is used for erasing.

Each EEPROM cell of the array of this invention includes a source-column region with a source formed in a semiconductor layer of a first conductivity-type, the source-column region being of a second, opposite conductivity-type. The cell also includes a drain-column region with a drain formed in the semiconductor layer, the drain-column region being of the second conductivity-type and being spaced from the source-column region. The source and drain define a channel that includes first and second sub-channels. The source-column region and the drain-column region are buried under thermal insulator regions. The source-column region and the drain-column region of adjacent cells may be separated by a thick-field insulator region.

A field plate has at least a portion thereof disposed over and insulated from the first sub-channel in the substrate so as to render the first sub-channel non-conductive upon application of a voltage to the field plate, the voltage being equal to or less than the voltage at the substrate. The first sub-channel is rendered conductive upon application to the field-plate of a read voltage that is positive with respect to the substrate.

A floating gate is disposed over and insulated from the face of the semiconductor layer in which the source and drain are formed, and the floating gate overlaps and is insulated from the field-plate. A first portion of the floating gate is disposed over and insulated from the second sub-channel, so as to render it non-conductive when a negative charge of sufficient magnitude resides on the floating gate. A second portion of the floating gate extends over the thermal insulator region formed over the source-column region, including the source. A third portion of the floating gate extends over the thermal insulator region formed over the drain column region, including the drain. Two tunnelling windows are formed between these second and third portions of the floating gate and extensions of the source-column and drain-column regions.

The control gate is formed over and insulated from the floating gate so as to be capacitively coupled thereto, such that upon application of predetermined programming voltages to the source, the drain, the control gate and the field plate, the floating gate is programmed (such as with a negative charge) through the tunnelling window adjacent the source-column region extension. Similarly, upon application of predetermined erasing voltages to the source, the drain, the control gate and the field plate, the floating gate is erased through the tunnelling window adjacent the drain-column region extension.

BRIEF DESCRIPTION OF THE DRAWINGS

The novel features believed characteristic of the invention are set forth in the appended claims. The invention itself, however, as well as other objects and advantages thereof, will be best understood by reference to the following description of particular embodiments thereof, when read in conjunction with the accompanying drawings, in which:

FIG. 3 is a plan view of a small part of a semiconductor chip of FIG. 1 having memory cells according to one embodiment.

FIGS. 4a-4d are elevation views in section of the semiconductor device of FIG. 3, respectively taken along the lines a—a, b—b, c—c and d—d of FIG. 3.

DETAILED DESCRIPTION OF SPECIFIC EMBODIMENT

Figure 1:
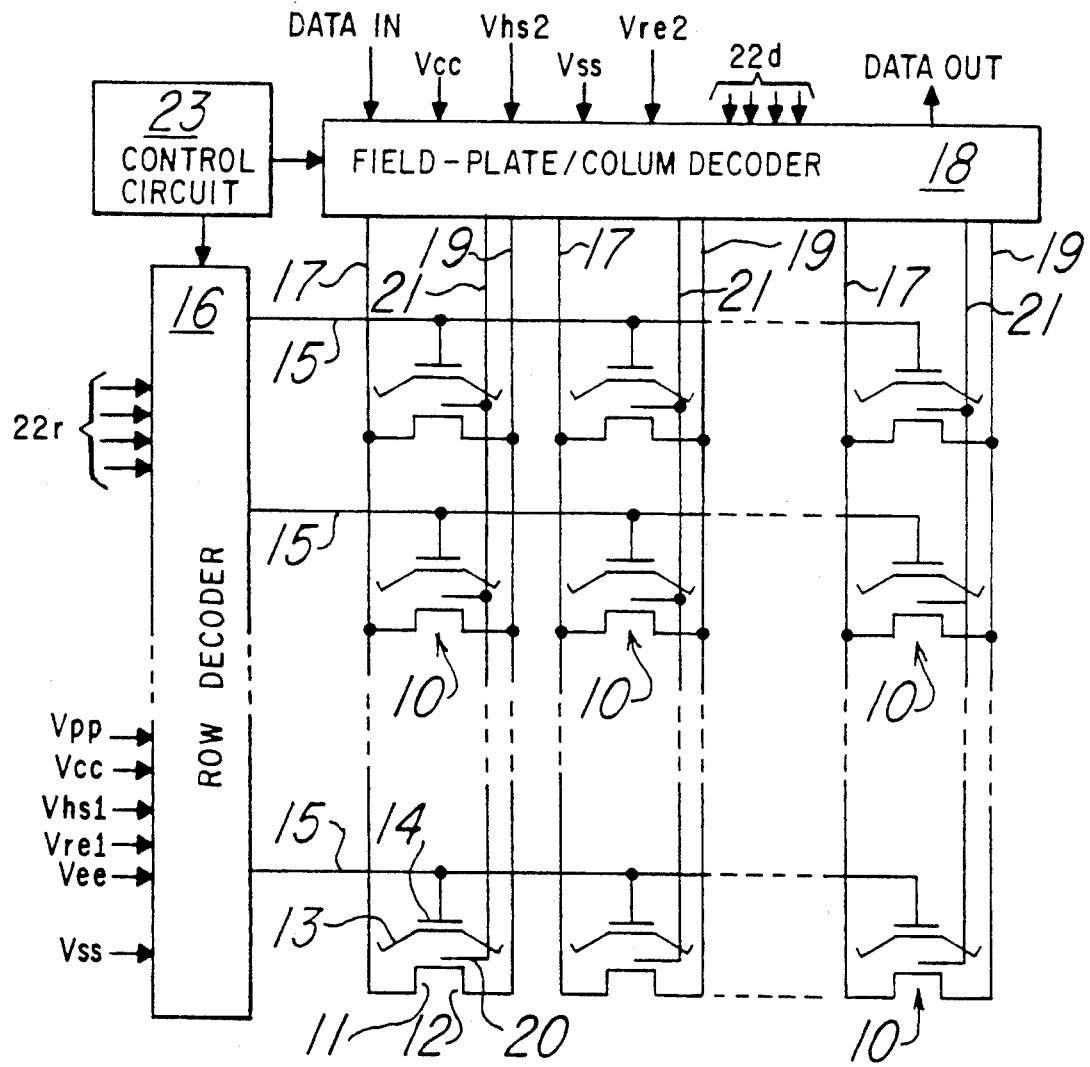
FIG. 1 is a schematic representation, in partial block form, of the circuit of the device of this invention.

Referring to FIG. 1, an array of memory cells, which is an integral part of a memory chip, is shown according to the invention. Each cell is a floating-gate transistor 10 having a source 11, a drain 12, a floating gate 13 and a control gate 14. Each of the control gates 14 in a row of cells is connected to a row line 15, and each of the row lines 15 is connected to a row decoder 16. Each of the sources 11 in a column of cells is connected to, or included in, one of a number of parallel source-column lines 17, and each of the source-column lines 17 is connected to a field-plate/column decoder 18, which includes source-column line decoding circuitry. Each of the drains 12 in a column of cells is connected to, or included in, one of a number of parallel drain-column lines 19, and each of the drain-column lines 19 is connected to the field-plate/column decoder 18, which includes drain-column line decoding circuitry. Source-column lines 17 and drain-column lines 19 are formed at an angle to row lines 15.

Two Fowler-Nordheim tunnelling window areas are under the floating gate 13 of each cell 10. The first Fowler-Nordheim tunnelling window is located over an extension of the source-column line 17 connected to the source 11 of each such cell 10. The second Fowler-Nordheim tunnelling window is located over an extension of the drain-column line 19 connected to the drain 12 of each such cell 10.

In addition, each cell 10 has a field plate 20. Each field plate 20 is connected to, or is part of, a field-plate-column line 21 and each field-plate-column line 21 is connected to field-plate/column decoder 18, which includes field-plate-column switching circuitry as well as other column-line decoding circuitry. While field-plate/column decoder 18 is illustrated as including field-plate-column line switching circuitry as well as source-column line and drain-column line circuitry, such circuity may be distributed over the surface of the memory array and/or may be included in a separate microprocessor.

During a "flash" erase mode, the field-plate/column decoder 18 functions to apply a positive voltage such as the supply voltage Vcc (approximately +5 volts) to all of the drain-column lines 19. The field-plate/column decoder 18 may function to apply reference potential Vss or a negative voltage to all of the field-plate-column lines 21, or decoder 18 may allow all of the field-plate-column lines to float. The field-plate/column decoder 18 also functions to apply reference voltage Vss to all of the source-column lines 17. The row decoder 16 functions to apply a high negative voltage Vee (approximately −11 volts) to all of the row lines 15. The excess electrons are removed from the floating gates 13 of all of the programmed cells 10. The field-plate 20 prevents conduction between sources 11 and drains 12 of the cells 10 during the erase cycle. The flash erase operation may be used to erase the whole memory array, or with additional circuitry, may be used to erase one or more individual blocks of the memory array. With all of the row lines 15 at potential Vee, block erasing by column may be accomplished simply by energizing the appropriate drain-column line 19 selected for erasing at +5 volts while placing all other source-column lines 17, all other drain-column lines 19 and at least the field-plate-column line 21 of the selected row at reference potential Vss. Block erasing by row may be accomplished simply by applying Vee to the selected row 15, Vss to all deselected rows 15, +5 volts to all drain-column lines 19, Vss to all source-column lines 17 and Vss to all field-plate-column lines 21. As in all arrays without split-gate cells, care must be taken not to over-erase the floating-gates 13 Or, if the floating-gates 13 are over-erased, the over-erased condition should be corrected.

In the read mode, the field-plate/column decoder 18 functions, in response to signals at inputs 22d and in response to a signal from control circuit 23, to place a positive voltage such as the supply voltage Vcc (approximately +5 volts) on at least the field-plate-column line 21 connected to the selected cell 10 (The positive voltage may be placed on all of the field-plate-column lines 21). Applying Vcc to the selected field-plate-column line 21 renders a first sub-channel under the field plate 20 conductive. The row decoder 16 functions, in response to row address signals at inputs 22r and response to a signal from control circuit 23, to place a preselected read voltage Vre1 (approximately +3 volts) on a selected row line 15, including the control gate 14 of the selected cell 10. The preselected first read voltage Vre1 should be chosen such that its presence on the control gate 14 of a cell 10 will not program the floating gate 13 of that cell 10. Where applicable, the first read voltage Vre1 should also be chosen such that its presence on the control gate 14 of a cell 10 will not erase the floating gate 13 of that cell 10. The field-plate/column decoder 18 functions, in response to column address signals at inputs 22d and in response to a signal from control circuit 23, to place preselected second read voltage Vre2 (approximately +1 to +1.5 volts) on the selected drain-column line 19, including the drain region 12 of the selected cell 10. The field-plate/column decoder 18 functions to connect all source-column lines 17 to ground (or Vss). The row decoder 16 functions, in response to signals at inputs 22r and in response to a signal from control circuit 23, to apply a low voltage (ground or Vss) to deselected row lines 15. Selected cells, if having floating gates in a programmed state, will have second sub-channels that are rendered nonconductive. That is, current will not flow between the drain and the source through the first and second sub-channels and a "zero" will be sensed. Selected cells 10, if having floating gates in a non-programmed state, will have second sub-channels that are rendered conductive. That is, current will flow between the drain and the source through the first and second sub-channels and a "one" will be sensed. The presence or absence of current flow may be detected by a sense amplifier (not shown) connected to the DATA OUT terminal. Connections to the source 11 and drain 12 regions in the example above are interchangeable, and data may be sensed at the source terminal if the second read voltage Vre2 is applied to the source 11.

Figure 2:
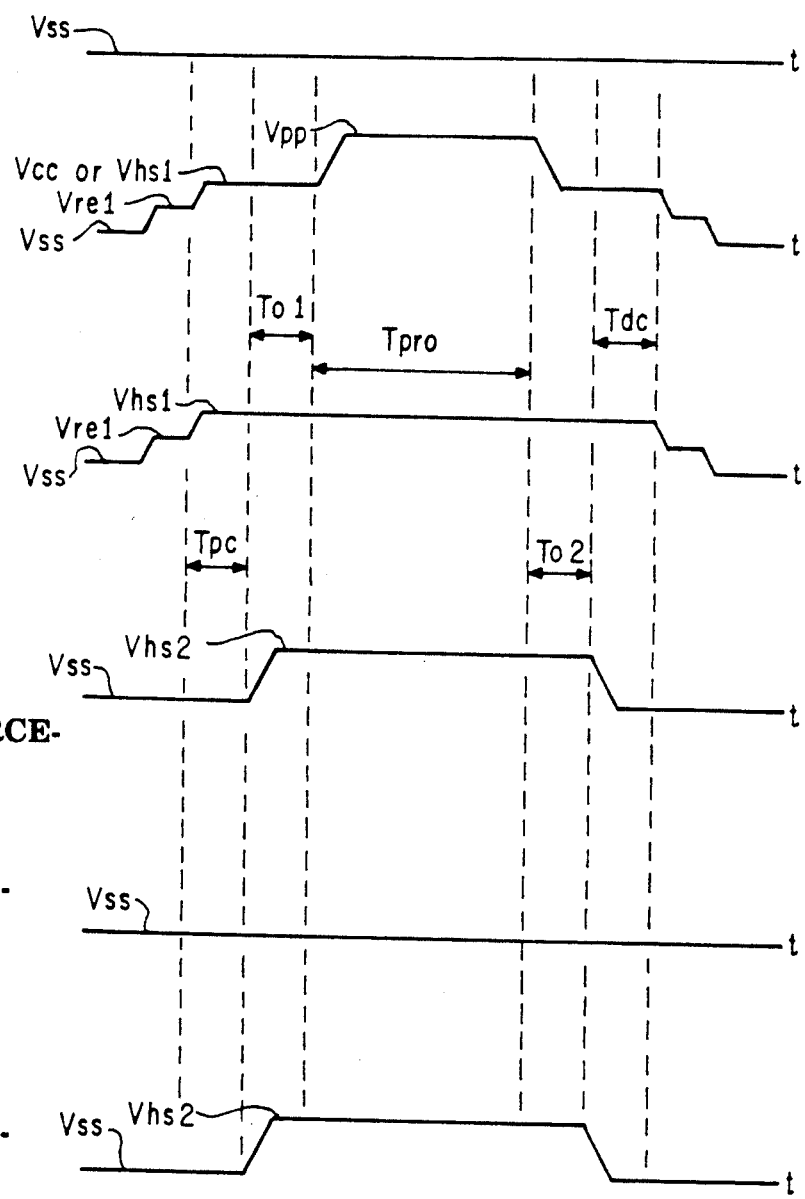
FIG. 2 illustrates the timing sequence of programming voltages applied to a selected cell of the array of this invention.

Referring now to FIG. 2, in a write or program mode, the field-plate/column decoder 18, in response to field-plate/column address signals on inputs 22d and in response to a signal from control circuit 23 (which may include an externally located microprocessor), functions to place a preselected blocking voltage (Vss, ground or negative voltage) on the field plates 20 of at least the column of cells 10 including the cell 10 selected for programming (The preselected blocking voltage Vss may be placed on all field-plate-column lines 21 in a memory array). At any convenient time in the beginning part of the programming cycle, field-plate/column decoder 18, in response to signals at inputs 22d and in response to a signal from control circuit 23, functions to place reference voltage (Vss, reference potential, or non-positive value) on the selected source-column line 17, including the source region 11 of the cell 10 selected for programming. At the time the program operation commences, the row lines 15 may have a read voltage Vre1 applied by row decoder 16.

At the start of a programming operation, row decoder 16, in response to signals at inputs 22r and in response to a signal from control circuit 23, functions to place a first preselected programming voltage Vhs1 (approximately +7 to +10 volts) on all of the row lines 15, including all of the control gates 14. (For convenience, a second value of Vhs1, such as the approximately +5 volt supply voltage Vcc, may be placed on the selected row line 15 during this step.) First preselected voltage Vhs1 should be sufficiently close to reference voltage Vss that the floating gates 13 associated with the deselected row lines 15 will not be programmed with reference voltage Vss connected to the sources 11 and drains 12 of those deselected cells 10.

After a precharge time interval Tpc, field-plate/column decoder 18, in response to signals at inputs 22d and in response to a signal from control circuit 23, functions to place a second preselected voltage Vhs2 (approximately +6 to +7 volts above Vss) on all source-column lines 17 and all drain-column lines 19 except the source-column line 17 connected to the selected cell 10. The second preselected voltage Vhs2 prevents programming from taking place on the drain 12 side of selected cell 10 and prevents inadvertent programming of any deselected non-programmed cells 10 connected to the selected row line 15. The first and second preselected programming voltages may be the same and should be chosen such that the voltage difference is insufficient to cause de-programming of pre-programmed cells in the selected or deselected row lines 15. At this time, second pre-selected voltage Vhs2 may be applied to the selected source-column line 17 to prevent programming of the selected cell 10 (write a "1" in the selected cell 10).

After a first time delay interval To1, row decoder 16 functions, in response to row address signals on inputs 22r and in response to a signal from control circuit 23, to place a preselected third programming voltage Vpp (approximately +16 to +18 volts) on a selected row line 15, including the control gate 14 of the cell 10 selected for programming. The third programming voltage Vpp may be placed on the control gate 14 in a gradual manner so as to reduce voltage-induced stress on the selected cell 10. After a programming time interval Tpro, the voltage applied to selected row line 15 is reduced from third programming voltage Vpp to first programming voltage Vhs1 (which may be Vcc for the selected row line 15).

After a second time delay interval To2, the voltage applied to the deselected source-column lines 17 and to all drain-column lines 19 is reduced from second programming voltage Vhs2 to reference potential Vss.

After a discharge time interval Tdc, the voltage applied to the selected and deselected row lines 15 is reduced from first programming voltage Vhs1 to first read voltage Vre1 (or to Vss).

The blocking voltage Vss remains on the field-plate 20 of the selected cell 10 during at least the time interval in which the third programming voltage Vpp is applied in order to prevent conduction between source 11 and drain 12 of the selected cell 10 and, of course, remains on field-plate 20 at any time during the programming cycle when the source 11 and drain 12 may be at different potentials.

The preselected third programming voltage Vpp must differ sufficiently from the reference voltage Vss (the fourth programming voltage) that electrons will migrate by Fowler-Nordheim tunnelling to the selected floating gate 13 and, as a result, program that selected floating gate 13. The floating gate 13 of the selected cell 10 will be charged with electrons, and the electrons in turn render the source-drain path under the floating gate 13 of the cell 10 nonconductive, a state which is read as a "zero" bit.

While the voltage-time characteristics of FIG. 2 are shown as straight line segments for illustration purposes, actual voltage transients have capacitive-charge and capacitive-discharge shapes.

The field-plate 20 may be formed near the source 11 of each cell 10 rather than near the drain 12. Therefore, the terms "source" and "drain" as used herein are interchangeable.

For convenience, a table of read, write and erase voltages is given in the Table below, in which source-side tunnelling windows are used for programming and in which drain-side tunnelling windows are used for erasing:

TABLE

|  | Read | Write | Flash Erase |
| --- | --- | --- | --- |
| Selected Row Line | 3V | 16–18V | −11V (All) |
| Deselected Row Lines | 0V | 7V |  |
| Selected Source Line | 0V | 0V | 0V (All) |
| Deselected Source Lines | Float | 7V |  |
| Selected Drain Line | 1–1.5V | 7V | 5V (All) |
| Deselected Drain Lines | 1–1.5V | 7V |  |
| Field-Plate Lines | 5V | 0V | 0V |

Referring now to FIGS. 3 and 4a–4d, an array of electrically-erasable, electrically-programmable memory cells 10 is shown formed in a face of a semiconductor body, such as a silicon substrate, 24. Only a very small part of the substrate 24 is shown in the FIGs., it being understood that these cells 10 are part of an array of a very large number of such cells 10. A number of control gates 14/row lines 15 are formed by third-level polycrystalline silicon (polysilicon) strips extending along the face of the substrate 24. Control gates 14 are separated from floating-gates 13 by inter-level insulators 25. Source-column regions or lines 17 are formed beneath first thermal insulator regions 26a in the face. Drain-column regions or lines 19 are formed beneath second thermal insulator regions 26b in the face. Drain-column lines 19 are parallel to and spaced from source-column lines 17. These buried column regions or lines 17,19 include the sources 11 for each of the cells 10 and include the drains 12 for each cells 10. A field-plate 20 extends over first sub-channel 27a of each cell 10 and over at least a part of thermal insulator region 26b. Field-plate 20 acts to switch first sub-channel 27a from a conductive state to a nonconductive state, depending on the voltages applied to field-plate-column line 21. A floating-gate 13 for each cell 10 is formed by a second-level polysilicon layer extending across a second sub-channel 27b between spaced-apart source 11 and drain 12. Each floating-gate 13 also extends over thermal insulator regions 26a and 26b, and extends over at least parts of LOCOS thick field oxide regions 28. LOCOS thick field oxide regions 28 electrically isolate adjacent cells 10. Field-plate 20 is separated from floating gate 13 of cell 10 by a field-plate insulator layer 29. A gate insulator 30, such as an oxide layer, is formed over the sub-channels 27a and 27b. The two "horizontal", or row-direction, edges of the floating-gate layer 13 for a cell 10 are aligned with the edges of a row line 15. For explanatory purposes, the edges are illustrated in FIG. 3 as being slightly misaligned.

A first Fowler-Nordheim tunnelling window 31 for programming is formed over an extension of source-column line 17 between first thermal insulator region 26a and a LOCOS field oxide region 28. A second Fowler-Nordheim tunnelling window 31 for erasing is formed over an extension of drain-column line 19 between second thermal insulator region 26b and a LOCOS field oxide region 28. The tunnelling window 31 insulators may be formed with a thinner oxide layer, about 100 A, compared to the oxide dielectric layer 30 of about 350 A at the channel. Programming and erasing can be performed at relatively low externally-applied voltages using this structure. The capacitance between control-gate layer 14 and floating-gate layer 13, compared to the capacitance between floating-gate layer 13 and source 11 or substrate 24, is more favorable because the floating-gate layer 13 extends out across thermal insulator regions 26a and 26b and LOCOS field oxide region 28. Therefore, a larger fraction of the programming/erasing voltages applied between control gate 14 and either source-column line 17 or drain-column line 19 will appear between floating-gate layer 13 and column lines 17 and 19. The cell 10 is referred to as "contact-free" in that no source/drain contact is needed in the vicinity of cell 10 itself.

As illustrated in FIG. 3, the channels of cells 10 in adjacent rows may be electrically isolated by LOCOS field oxide regions 32. In the alternative, the channels of adjacent cells 10 may be electrically isolated by junction isolation using a P-type dopant in the same region as the LOCOS field oxide regions 32 as explained, for example, in U.S. patent application Ser. No 07/494,051, also assigned to Texas Instruments Incorporated.

Note that the array of cells 10 is not of the "virtual-ground-circuit" type; that is, there is a dedicated source-column 17 for the sources 11 in a column of cells 10 and a dedicated drain-column line 19 for drains 12 in a column of cells 10.

A method of making the device of FIGS. 1, 3, and 4a-4d will be described in reference to FIGS. 5a-5f. The starting material is a slice of P-type silicon of which the (P-) epitaxial semiconductor layer or substrate 24 is only a very small portion. The slice is perhaps 6 inches in diameter, while the portion shown in FIG. 3 is only a few microns wide. A number of process steps would be performed to create transistors peripheral to the array, and these will not be discussed here. For example, the memory device may be of the complementary field-effect type having N-wells and P-wells formed in the substrate 24 as part of a prior process to create peripheral transistors.

Figure 5A:
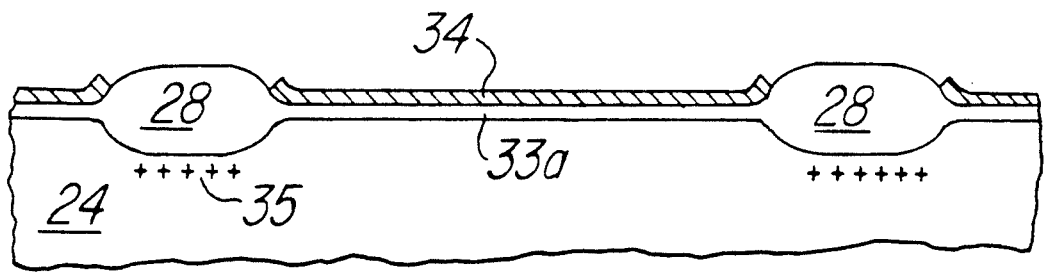
FIGS. 5a-5f are elevation views in section of the semiconductor device of FIG. 3, taken along the lines a—a of FIG. 3 at successive stages in the manufacture thereof.

As illustrated in FIG. 5a, a layer 33a of oxide, then a layer 34 of nitride, are formed on the surface of P-substrate 24. The nitride layer 34 is patterned and etched to define an active device area for an EEPROM cell 10. Substrate layer 24 is then selectively doped with a boron implant at a dose of approximately $8 \times 10^{12}$ cm$^{-2}$ at an energy of about 70-150 KeV is performed to create P-channel stop regions 35. Then, thick field oxide regions 28 are thermally grown in a localized oxidation process to a thickness of approximately 9000 to 11,000 Angstroms by exposing the substrate 24 to steam for several hours using any conventional technique. The thick field oxide regions 28 grow beneath the edges of adjacent nitride layer 34, creating bird's beaks instead of sharp transitions.

Figure 5B:
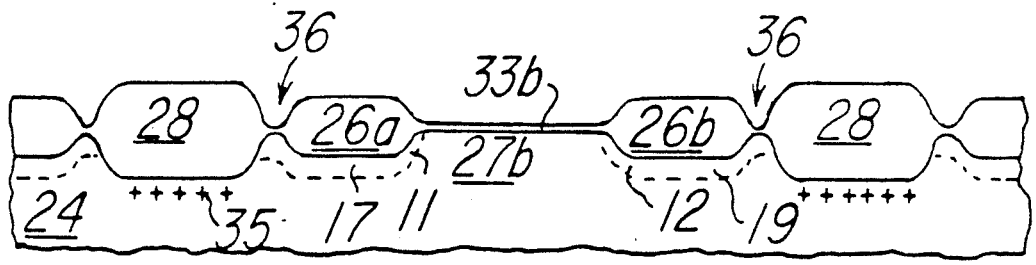

Referring next to FIG. 5b, the nitride layer 34 and oxide layer 33a are removed. A layer (not shown) of photoresist is deposited and patterned to act as an implant mask for selectively doping substrate layer 24 with an arsenic implant at a dose of about $6 \times 10^{15}$ cm$^{-2}$ and at an energy of about 135 KeV. This implant creates source column regions or lines 17 and drain-column regions or lines 19, including sources 11 and drains 12. Following the implant of source-column lines 17 and drain-column lines 19, a clean-up step, and an anneal step, another thermal step is performed with steam at 800°-900° C. to differentially grow thermal insulator regions 26a and 26b. The thermal oxide regions 26a and 26b will be grown to a thickness of approximately 2500 to 3500 Angstroms. At the same time, a new oxide insulator layer 33b between the drains 12 and the sources 11 is grown to a thickness of approximately 200-300 Angstroms.

In the areas where bird's beaks have been formed, the edge of the originally-formed thick field oxide region 28 has masked the arsenic implant so that the concentration is lower. Transition areas 36 are formed in the bird's beak areas because the oxide growth in those areas is less than that of the thermal oxide regions 26a and 26b. As a result, the oxide thickness in the transition areas 36 is smaller than either the thickness of thermal insulator regions 26a and 26b or the thickness of field oxide regions 28.

At this point, a self-aligned threshold-voltage-adjust implant may be performed in the area between thermal insulator regions 26a and 26b.

Figure 5C:
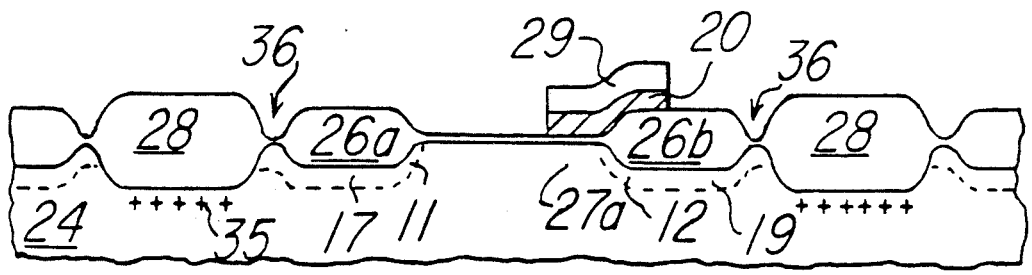

Referring next to FIG. 5c, a conductive layer, which will become field-plate 20, of polycrystalline silicon (polysilicon) is deposited over the face of the slice. This conductive layer is deposited to a thickness of approximately 2000 to 3500 Angstroms. The polysilicon layer (also known as the "poly 1" layer) is highly doped to render it conductive. This may be accomplished, for example, by applying an N+ dopant to the polysilicon layer after it has been deposited. A relatively thick oxide insulator layer (or oxide-nitride insulator layer, or oxide-nitride-oxide insulator layer) which will become field-plate insulator layer 29, is deposited over the "poly 1" layer. The insulator layer 29 is then patterned with photoresist and etching is performed to form field-plate-column line 21 including field-plate 20 and field-plate insulator 29. Field-plate-column lines 21 may be connected to each other, if desired, by appropriate masking of the "poly 1" layer during this step. The part of field-plate 20 extending over the area between source 11 and drain 12 defines a first sub-channel 27a. The remainder of the area between source 11 and drain 12 defines a second sub-channel 27b. The oxide layer 33b over second sub-channel 27b is removed before stripping the photoresist. A clean-up step is then performed.

Figure 5D:
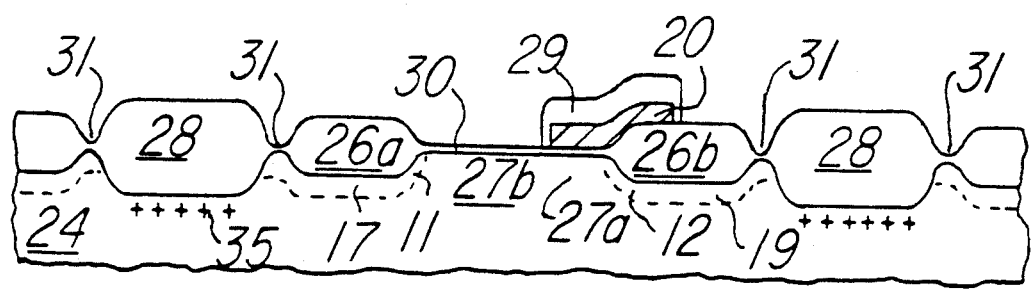

Referring to FIG. 5d, a relatively thin insulator layer 30, such as a oxide, is next grown or otherwise formed over the structure using conventional techniques. During this step, the exposed edges of field-plate 20 (and field-plate-column line 21) are coated with insulation, providing necessary electrical isolation. At this stage, insulator layer 30 may be approximately 300 to 500 Angstroms thick. The oxide insulator on the edges of field-plate layer 20 will be considerably thicker than 300 to 500 Angstroms if the oxidation rate ratios between non-doped single crystal silicon and heavily doped polysilicon are adjusted appropriately.

Referring again to FIG. 5d, tunnelling windows are formed in the transition areas 36. This is done by etching through the oxide over the transition areas 36 to the silicon using photoresist as a mask, then regrowing a thinner oxide insulator layer for the tunnelling windows. This will create window insulator layers 31 that are approximately 100 Angstroms thick. At the time that this oxidation occurs, the gate oxide layer 30 will grow to approximately 350 Angstroms, depending on its thickness before this step, which may be adjusted as described above. Before etching the oxide in the transition areas 36, a light implant of phosphorous dopant is preferably employed through the tunnelling window areas 31 to form extensions of column lines 17 and 19 and to improve the operation of the cells. Because of the curved surfaces of the transition areas 36, the width of the tunnelling windows 31 may be controlled by varying the length of time for the etch through the transition areas 36. This self-aligned, sublithographic window is discussed in U.S. patent application Ser. No. 07/360,558, for example.

At this time, a threshold-adjust implant may be performed for sub-channel 27b, if needed.

Figure 5E:
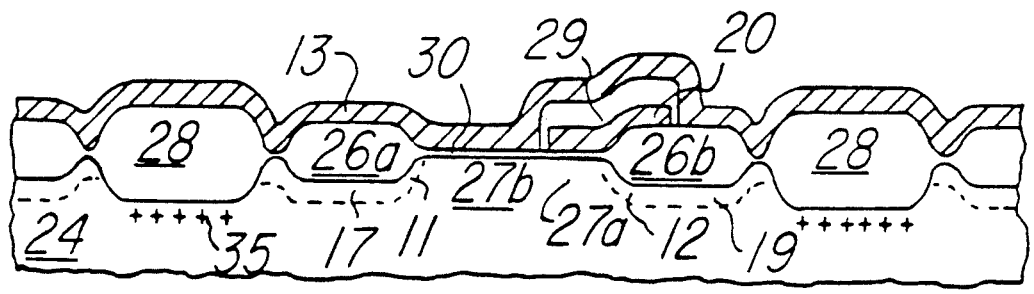

Referring now to FIG. 5e, a second polycrystalline silicon layer ("poly 2"), which will become floating gates 13, is deposited over the face and is highly doped to be N+.

Figure 5F:
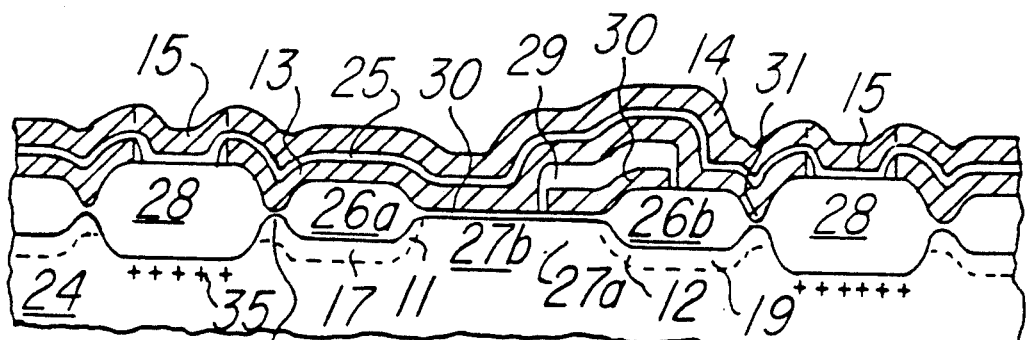

Referring now to FIG. 5f, the second polysilicon layer is patterned with a photoresist and etched to form floating-gate strips parallel to the column lines 17, 19 and 21, followed by a photoresist strip and clean-up. The edges of the strips that will form floating gates 13 may be protected by forming sidewall oxide regions using conventional procedures. Inter-level insulator layer 25 is then formed over the structure, including second polysilicon layer 13. Inter-level insulator layer 25 can be an oxide layer, an oxide-nitride-oxide layer, or another suitable insulator-material layer. A third polycrystalline silicon layer ("poly 3"), which will become control gates 14/row lines 15 is then deposited over the face of the slice and is highly doped to be N+. After de-glazing and patterning, a stack etch of (i) the third polysilicon layer 14,15, (ii) the inter-level insulator layer 25, and (iii) the second poly strips 13 is performed. This stack etch defines a plurality of elongated control gates 14/row lines 15 that run substantially parallel to each other and at an angle to column lines 17, 19 and 21, as shown in FIGS. 3 and 4b–4d. This same stack etch separates and defines the remaining edges of the floating gates 13. The field-plate 20 is masked by field-plate insulator layer 29 such that it continues to be a continuous elongated conductor.

Peripheral logic CMOS devices may be completed after this step. An oxide layer may be grown or formed after this process on the sides and top of the stack for improved data retention. A borophosphosilicate glass (BPSG) layer (not shown) may then be deposited over the face of the slice. Off-array contacts may be made through the BPSG layer, as well as on-array contacts that are made from metal bitlines to respective diffused regions periodically in a y-direction. In addition, metal contacts to row lines 15 are made. The metal bitlines are formed on the BPSG layer to run over and be parallel to diffused regions. This is followed by a protective overcoat process.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

We claim:

1. A method for fabricating a nonvolatile memory cell at a face of a semiconductor layer of a first conductivity-type, comprising:

selectively doping said semiconductor layer with a dopant of a second conductivity-type opposite said first conductivity-type to create a source-column region including a source and to create a drain-column region including a drain, said drain spaced from said source by first and second sub-channels, said first sub-channel adjacent said drain;

differentially growing thermal insulator regions over said source-column region and said drain-column region;

forming a first conductive layer and a first insulator layer over said face;

selectively etching said first conductive layer and said first insulator layer to define field-plate and a field-plate insulator over a part of said drain-column region and over said first sub-channel region;

forming first and second tunnelling windows, said first tunnelling window formed over said source-column region on the side of said source-column region opposite said second sub-channel region, said second tunnelling window formed over said drain-column region on the side of said drain-column region opposite said first sub-channel region;

forming a floating gate and a control gate, said floating gate formed over and insulated from said second sub-channel region, formed over said first tunnelling window and formed over said second tunnelling window, each said control gate formed over and insulated from said floating gate.

2. The method of claim 1, including:

forming an oxide-nitride-oxide layer on said floating-gate.

3. The method of claim 1, including:

implanting dopant through said first and second tunnelling windows.

4. A method for fabricating a nonvolatile memory array at a face of a semiconductor layer of a first conductivity-type, comprising:

selectively doping said semiconductor layer with a dopant of a second conductivity-type opposite said first conductivity-type to create source-column lines and to create drain-column lines, each said drain-column line spaced from each said source-column line;

differentially growing thermal insulator regions over said source-column lines and said drain-column lines;

forming a first conductive layer and a first insulator layer over said face;

selectively etching said first conductive layer and said first insulator layer to define field-plate lines and field-plate insulators, each said field-plate line and each said field plate insulator formed over a part of a said thermal insulator region over a said drain-column line and over first sub-channels adjacent said drain-column line;

forming first and second tunnelling windows, said first tunnelling windows formed over said source-column lines on sides of said source-column lines opposite second sub-channels adjacent said first sub-channels, said second tunnelling windows formed over said drain-column lines on the sides of said drain-column lines opposite said first sub-channels;

forming floating-gate strips over said face, said floating-strips over said first and second tunnelling windows over and insulated from said second sub-channels;

forming a row-line/control-gate layer insulated from said floating-gate strips;

forming row-lines/control-gates and floating gates from said row-line/control-gate layer and from said floating-gate strips.

5. The method of claim 4, including:

forming an oxide-nitride-oxide layer on said floating-gate.

6. The method of claim 4, including:

implanting dopant through said first and second tunnelling windows.

* * * * *